(12) United States Patent
Hsu et al.

(10) Patent No.: US 11,495,743 B2
(45) Date of Patent: Nov. 8, 2022

(54) NON-VOLATILE MEMORY DEVICE AND MANUFACTURING TECHNOLOGY

(71) Applicant: Taiwan Semiconductor Manufacturing Co., Ltd., Hsin-Chu (TW)

(72) Inventors: Chern-Yow Hsu, Chu-Bei (TW); Chung-Chiang Min, Zhubei (TW); Shih-Chang Liu, Alian Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 46 days.

(21) Appl. No.: 16/866,704

(22) Filed: May 5, 2020

(65) Prior Publication Data

US 2021/0351348 A1 Nov. 11, 2021

(51) Int. Cl.
| | |
|---|---|
| *H01L 45/00* | (2006.01) |
| *H01L 27/22* | (2006.01) |
| *H01L 27/24* | (2006.01) |
| *H01L 43/02* | (2006.01) |
| *H01L 43/12* | (2006.01) |

(52) U.S. Cl.
CPC ........ *H01L 45/1675* (2013.01); *H01L 27/228* (2013.01); *H01L 27/2436* (2013.01); *H01L 43/02* (2013.01); *H01L 43/12* (2013.01); *H01L 45/08* (2013.01); *H01L 45/1233* (2013.01); *H01L 45/1253* (2013.01)

(58) Field of Classification Search
CPC ............... H01L 45/1675; H01L 27/228; H01L 27/2436; H01L 43/02; H01L 43/12; H01L 45/08; H01L 45/1233; H01L 45/1253
See application file for complete search history.

(56) References Cited

U.S. PATENT DOCUMENTS

| | | |
|---|---|---|
| 9,779,794 B2 | 10/2017 | Doyle et al. |
| 2012/0091425 A1 | 4/2012 | Kawashima et al. |
| 2013/0034917 A1 | 2/2013 | Lee |
| 2016/0351799 A1 | 12/2016 | Xue et al. |
| 2016/0365512 A1* | 12/2016 | Sung ..................... H01L 45/147 |
| 2017/0117467 A1* | 4/2017 | Chang ................ H01L 27/2436 |
| 2017/0141300 A1 | 5/2017 | Trinh et al. |
| 2019/0043795 A1 | 2/2019 | Chen et al. |

(Continued)

FOREIGN PATENT DOCUMENTS

KR 20030002095 A 1/2003

*Primary Examiner* — Khaja Ahmad
*Assistant Examiner* — Pavel G Ivanov
(74) *Attorney, Agent, or Firm* — Eschweiler & Potashnik, LLC

(57) ABSTRACT

A memory cell with hard mask insulator and its manufacturing methods are provided. In some embodiments, a memory cell stack is formed over a substrate having a bottom electrode layer, a resistance switching dielectric layer over the bottom electrode layer, and a top electrode layer over the resistance switching dielectric layer. A first insulating layer is formed over the top electrode layer. A first metal hard masking layer is formed over the first insulating layer. Then, a series of etch is performed to pattern the first metal hard masking layer, the first insulating layer, the top electrode layer and the resistance switching dielectric layer to form a first metal hard mask, a hard mask insulator, a top electrode, and a resistance switching dielectric.

20 Claims, 11 Drawing Sheets

(56) References Cited

U.S. PATENT DOCUMENTS

| | | |
|---|---|---|
| 2019/0074440 A1* | 3/2019 | Yang ........................ H01L 43/12 |
| 2020/0020745 A1 | 1/2020 | Chen et al. |
| 2020/0075857 A1 | 3/2020 | Chou |
| 2020/0106011 A1 | 4/2020 | Chen et al. |
| 2021/0135107 A1* | 5/2021 | Kim .................... H01L 45/1641 |

* cited by examiner

NON-VOLATILE MEMORY DEVICE AND MANUFACTURING TECHNOLOGY

BACKGROUND

Many modern day electronic devices contain electronic memory. Electronic memory may be volatile memory or non-volatile memory (NVM). Non-volatile memory is able to store data in the absence of power, whereas volatile memory is not. Non-volatile memory such as magnetoresistive random-access memory (MRAM) and resistive random access memory (RRAM) are promising candidates for next generation non-volatile memory technology due to relative simple structures and their compatibility with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
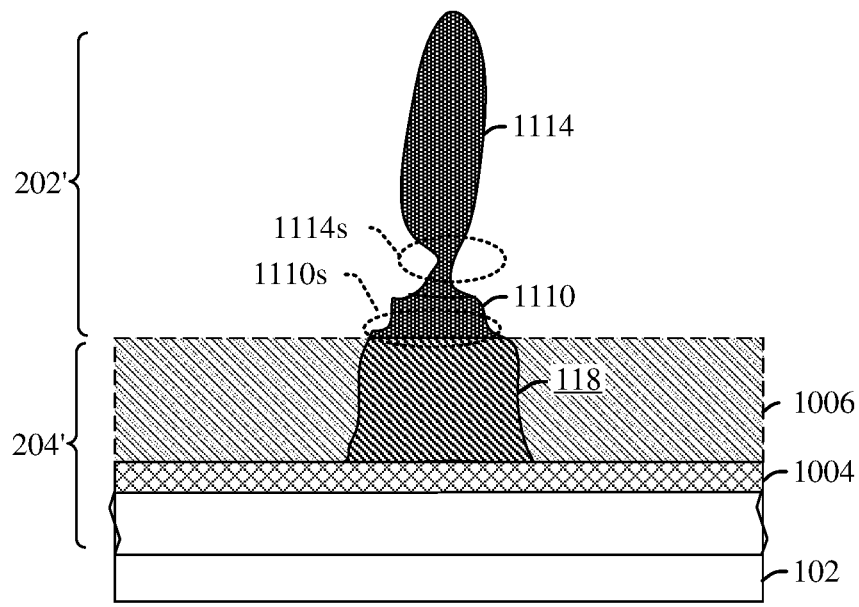
FIG. 1 illustrates a schematic view for manufacturing a memory cell.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "First", "second", "third", etc. are not intended to be descriptive of the corresponding element. Therefore, "a first dielectric layer" described in connection with a first figure may not necessarily corresponding to a "first dielectric layer" described in connection with another figure.

Non-volatile memory such as magnetoresistive random-access memory (MRAM) or resistive random access memory (RRAM) includes an array of memory cells. A memory cell includes a stack of a top electrode and a bottom electrode separated by a resistance switching dielectric. Depending on a voltage applied to the pair of electrodes, the resistance switching dielectric will undergo a reversible change between a high resistance state associated with a first data state (e.g., a '0' or 'RESET') and a low resistance state associated with a second data state (e.g., a '0' or 'SET'). The resistance switching dielectric may be made of a variety of materials. For example, the resistance switching dielectric layer may comprise a magnetic tunnel junction (MTJ) structure having a pinned magnetic layer and a free magnetic layer, which are vertically separated by a dielectric barrier layer. As the demands of decreasing pitch size continues, patterning the memory cell stacks at low dimension and very dense pitch remains a challenge for high density non-volatile memory due to the difficulty of etching the memory cell stacks. In some embodiments, a hard masking stack is used for the patterning process. The hard masking stack may include dielectric hard masking layers made of dielectric materials such as silicon nitride or silicon oxynitride as well as one or more metal hard masking layers made of metal or metal alloys such as tantalum or tantalum nitride. Referring to a cross-sectional view 100 of FIG. 1 as an example, a hard masking stack 202' is formed on a memory cell stack 204' for patterning. The hard masking stack 204' may comprise a first metal hard masking layer 1110 and a second metal hard masking layer 1114, for example, a tantalum nitride layer and a tantalum layer. After patterning a top electrode layer 1006 of the memory cell stack 204' to form a top electrode 118, applicants observed shrinking and necking portions of the first metal hard masking layer 1110 and the second metal hard masking layer 1114 respectively circled as 1110s, 1114s. Galvanic effect on adjacent metals contributes to this problem. A metal is easier to be oxidized when contacting with a different metal with less redox potential. Here, the metal hard masking layers 1110, 1114 have more negative redox potential than the top electrode layer 1006 and thus are oxidized and etched during the patterning of the top electrode layer 1006. For example, applicants observed that a lateral width may shrink to about 35 nm for the first metal hard masking layer 1110 and about 15 nm for the second metal hard masking layer 1114 when the lateral width of the top electrode 118 is about 50 nm. This shrinking or necking problem could result in failure of the patterning process.

In view of the above, in some more advanced embodiments, the present application is related to an improved method of manufacturing a memory device using a hard masking stack, and corresponding NVM memory device structures. In some embodiments, an insulating layer is formed between two metal layers of different material when forming the hard masking stack for the memory device, such that the shrinking or necking problem discussed above can be reduced or avoided.

Figure 2:
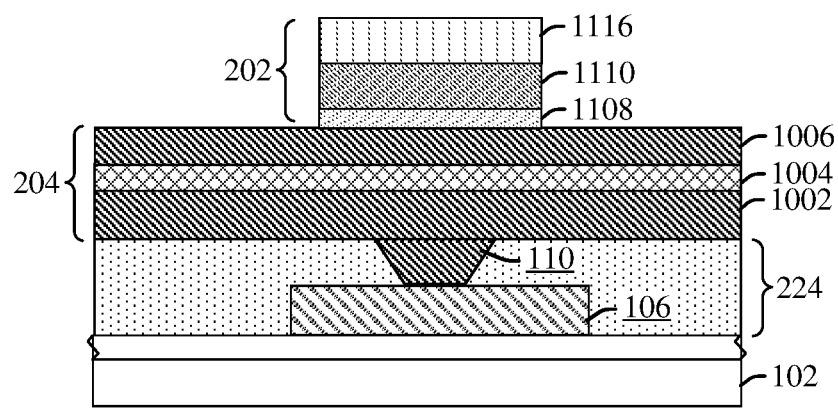
FIG. 2 illustrates a cross-sectional view of some embodiments of a memory cell with a hard masking stack including an insulating layer.

FIG. 2 illustrates a cross-sectional view 200 of some embodiments of a memory cell with a hard masking stack 202. The hard masking stack includes a first insulating layer 1108 disposed between a top electrode 1006 and a first metal hard masking layer 1110. More specifically, in some embodiments, as shown by FIG. 2, the hard masking stack 202 is formed over a memory cell stack 204 for patterning. More details of the patterning processes are described associated with FIGS. 11-17. The memory cell stack 204 may comprise a bottom electrode layer 1002, a resistance switching dielectric layer 1004, and the top electrode layer 1006 one stacked over another over a substrate 102. The top electrode layer 1006 may comprise or be made of a first kind of metal material (for example, tungsten). The hard masking stack 202 may include the first insulating layer 1108 at bottom, a first metal hard masking layer 1110 on the first insulating layer 1108, and a first dielectric hard masking layer 1116 over the first metal hard masking layer 1110. The first metal hard masking layer 1110 may comprise or be made of a second kind of metal material (for example, tantalum) different from that of the top electrode layer 1006. The first insulating layer 1108 is disposed at bottom of the hard masking stack contacting and separating the top electrode layer 1006 from the first metal hard masking layer 1110, such that prevents the shrinking or necking problem of the top electrode layer 1006 or the first metal hard masking layer 1110. Then, not shown by FIG. 2, a series of etch is performed to pattern the hard masking stack 202, the top electrode layer 1006, the resistance switching dielectric layer 1004, and the bottom electrode layer 1002 to correspondingly form a hard mask, a top electrode, a resistance switching dielectric, and a bottom electrode. The bottom electrode may be electrically coupled to a metal line of a metallization layer 224 through a bottom electrode via 110. A sidewall spacer and an etch stop layer may be subsequently formed along sidewalls and outlines of the patterned stack.

Figure 3:
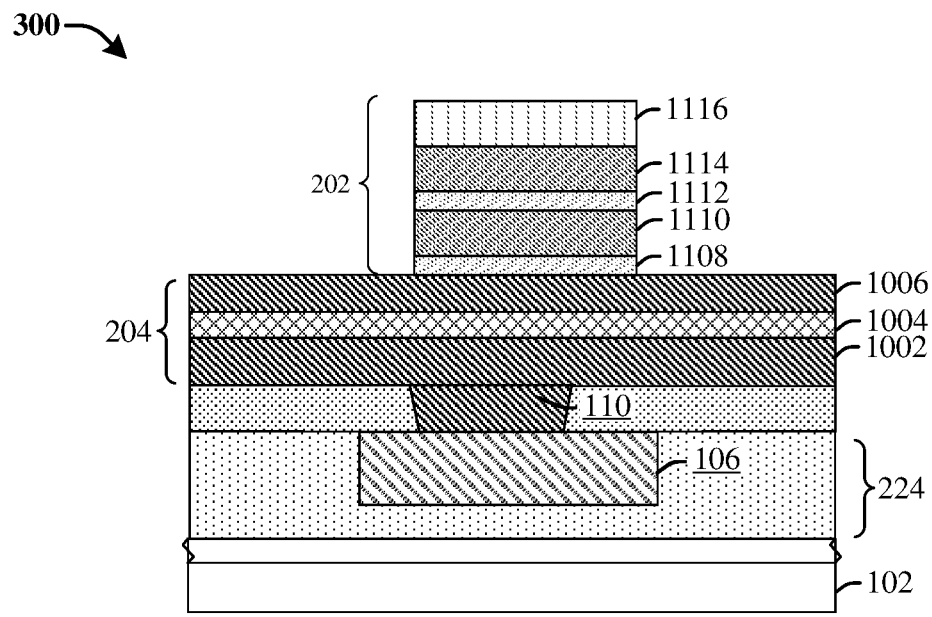
FIG. 3 illustrates a cross-sectional view of some alternative embodiments of a memory cell of FIG. 2 with a hard masking stack comprising multiple insulating layers.

FIG. 3 illustrates a cross-sectional view 300 of some alternative embodiments of a memory cell of FIG. 2 with the hard masking stack 202 comprising multiple insulating layers 1108, 1112. Though two insulating layers 1108, 1112 are shown in FIG. 3, the hard masking stack 202 may comprise more than two sets of metal hard masking layer and insulating layer one stacked over another. The additional sets of metal hard masking layers and insulating layers provide greater masking thickness for the memory cell patterning. More details of the patterning processes are described associated with FIGS. 11-17. As shown by FIG. 3 as an example, in some embodiments, a second insulating layer 1112 is disposed on the first metal hard masking layer 1110, and a second metal hard masking layer 1114 is disposed on the second insulating layer 1112. The second insulating layer 1112 separates the first metal hard masking layer 1110 and the second metal hard masking layer 1114, such that prevents the shrinking or necking problem of the first metal hard masking layer 1110 or the second metal hard masking layer 1114. The second metal hard masking layer 1114 may comprise a third kind of metal material different from that of the first metal hard masking layer 1110 or the top electrode layer 1006. For example, the second metal hard masking layer 1114 may comprise or be made of tantalum nitride. Tantalum may be a better material than tantalum nitride as a hard masking material for patterning due to its selectivity property. However, tantalum layer has high stress and may risk peeling issue if too thick.

Therefore, a hard masking stack including both tantalum and tantalum nitride can help to achieve a desired hard mask height while maintaining selectivity and stability. Other applicable metal materials are also within the scope of disclosure to be used as the metal hard masking layers 1110, 1114. The second insulating layer 1112 may comprise same or different dielectric material than that of the first insulating layer 1108 (for example, silicon dioxide). The second insulating layer 1112 and the first insulating layer 1108 may also comprise or be made of silicon carbide (SiC), silicon nitride (SiN), silicon oxycarbide (SiOC), silicon oxynitride (SiON), or the combination thereof. Other applicable dielectric materials are also within the scope of disclosure to be used as the second insulating layer 1112 or the first insulating layer 1108. In some embodiments, the second insulating layer 1112 and the first insulating layer 1108 may respectively have a thickness in a range of from about 1 nm to about 10 nm. In some alternative embodiments, the second insulating layer 1112 and the first insulating layer 1108 may respectively have a thickness in a range of from about 3 nm to about 10 nm. Having a thickness of the second insulating layer 1112 or the first insulating layer 1108 smaller than 3 nm may have non-uniform concern due to CVD film deposition capability. Having a thickness of the second insulating layer 1112 or the first insulating layer 1108 greater than 10 nm may not be desired since there are more selectivity benefits to use metal layers as hard masking layers than those insulating layers.

Figure 4:
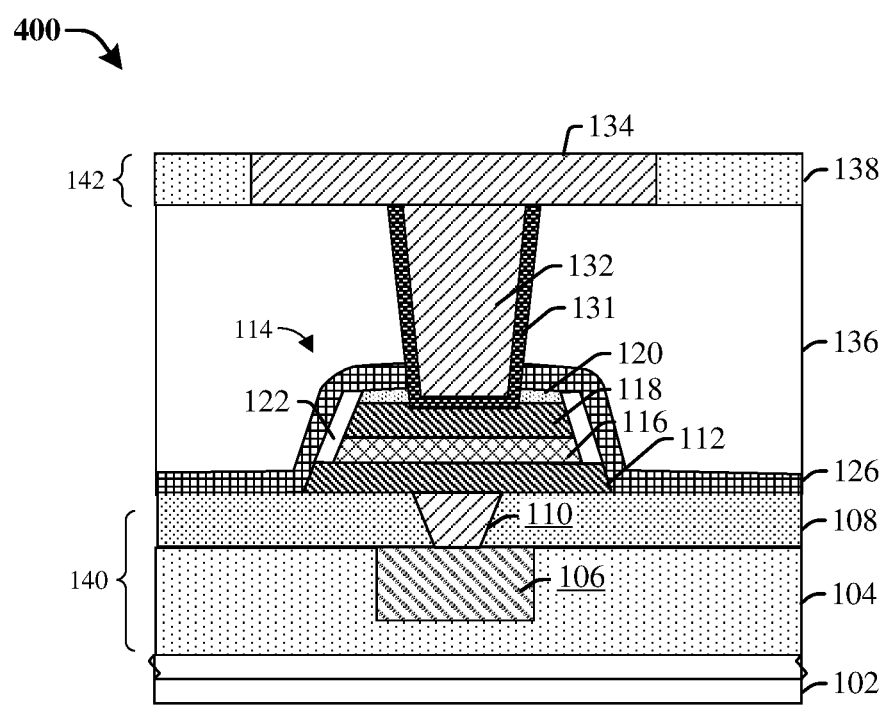
FIG. 4 illustrates a cross-sectional view of some embodiments of a memory cell with an insulating hard mask, where the memory cell of FIG. 4 may be a final product after patterning the memory cell of FIG. 2 or FIG. 3 according to the hard masking stack.

FIG. 4 illustrates a cross-sectional view 400 of some embodiments of a memory cell with an insulating hard mask. The memory cell of FIG. 4 may be an intermediate or final product after the memory cell of FIG. 2 or FIG. 3 is patterned according to the hard masking stack 202. In some embodiments, a memory cell 114 comprises a bottom electrode 112 disposed over a substrate 102. A resistance switching dielectric 116 is disposed over the bottom electrode 112 and having a variable resistance. A top electrode 118 is disposed over the resistance switching dielectric 116. During operation of the memory cell 114, voltages are applied between the top electrode 118 and bottom electrode 112 to read, set, or erase the memory cell 114 by forming or breaking one or more conductive filaments of the resistance switching dielectric 116. Thus the memory cell 114 can have a variable resistance in a comparatively low or high resistance state to stand for low or high bit status, for example.

A hard mask insulator 120 is disposed directly on the top electrode 118 and may have sidewalls aligned or coplanar with the top electrode 118. The hard mask insulator 120 may be a partial remaining of the first insulating layer 1108 shown in FIG. 2 or FIG. 3 from the memory cell patterning process. In some embodiments, a sidewall spacer 122 is disposed on an upper surface of the bottom electrode 112 and extended upwardly along sidewalls of the resistance switching dielectric 116 and the top electrode 118, and may extend to a lower part of the hard mask insulator 120. The sidewall spacer 122 may also extend to the whole sidewall surface of the hard mask insulator 120. An etch stop layer 126 is disposed over the substrate 102 and may conformally line the bottom electrode 112, the sidewall spacer 122, and extend over the hard mask insulator 120. The etch stop layer 126 may directly contact and cover a top surface of the insulating layer. The etch stop layer 126 and the sidewall spacer 122 comprise different materials or the same material with different densities. The sidewall spacer 122 and the etch stop layer 126 may also comprise one or more dielectric composition layers comprising, for example, silicon oxide, silicon nitride, silicon carbide, or the like. The sidewall spacer 122 may be used during the manufacture of the memory cell 114 to define a foot print of the bottom electrode 112. The etch stop layer 126 protects the top electrode 118 during the landing of the top electrode via 132.

According to some embodiments, the memory cell 114 may be inserted within a back-end-of-line (BEOL) metallization stack having a lower interconnect structure 140 and an upper interconnect structure 142 arranged over the substrate 102. The lower interconnect structure 140 includes a bottom metallization line 106 disposed within a bottom interlayer dielectric layer 104. The upper interconnect structure 142 includes a top metallization line 134 disposed within a top interlayer dielectric layer 138. The bottom interlayer dielectric layer 104 and the top interlayer dielectric layer 138 may be, for example, an oxide, a low-k dielectric (i.e., a dielectric with a dielectric constant k less than silicon dioxide) or an extreme low-k dielectric (a dielectric with a dielectric constant k less than about 2), and the bottom metallization lines 106 and the top metallization lines 134 may be, for example, a metal, such as copper.

The bottom electrode 112 of the memory cell 114 may be a conductive material, such as titanium, tantalum, titanium nitride, tantalum nitride, tungsten, ruthenium, molybdenum, cobalt or the combination thereof. An example thickness of the bottom electrode 112 can be in a range of from about 10 nm to 100 nm, or preferably 10 nm to about 20 nm. This example thickness, along with other example dimensions given hereafter, may for a certain fabrication node, and proportional scaling of these dimensions for other nodes is amenable. In some embodiments, the bottom electrode 112 is electrically coupled to the bottom metallization line 106 of the lower interconnect structure 140 through a bottom electrode via 110 arranged between the bottom electrode 112 and the bottom metallization lines 106. The bottom electrode via 110 may comprise titanium nitride for example. An example thickness of the bottom electrode via 110 can be in a range of from about 40 nm to about 50 nm. In some embodiments, a lower dielectric layer 108 is disposed surrounding the bottom electrode via 110. The lower dielectric layer 108 may comprise silicon carbide, silicon nitride, silicon oxide, or one or more layers of composite dielectric films, for example. An upper dielectric layer 136 is disposed over the lower dielectric layer 108. The upper dielectric layer 136 may comprise silicon oxide. The upper dielectric layer 136 may have a bottom surface directly contacts a top surface of the etch stop layer 126. The upper dielectric layer 136 may have a top surface directly contacts a bottom surface of the top interlayer dielectric layer 138.

In some embodiments, the memory cell 114 is a magnetoresistive random access memory (MRAM) cell and the resistance switching dielectric 116 can comprise a magnetic tunnel junction (MTJ) structure. The MTJ structure may have a bottom ferromagnetic layer and a top ferromagnetic layer separated by a tunnel barrier layer. In some other embodiments, the memory cell 114 is a resistive random access memory (RRAM) cell and the resistance switching dielectric 116 can comprise a RRAM dielectric layer. The resistance switching dielectric 116 may be a high-k layer (i.e., a layer with a dielectric constant k greater than 3.9), for example, tantalum oxide, tantalum hafnium oxide, tantalum aluminum oxide, or another material that includes tantalum, oxygen, and one or more other elements. The resistance switching dielectric 116 may also include other composite layers. For example, the resistance switching dielectric 116 may include a seed layer disposed at bottom and/or a cap layer disposed on top. An example thickness of the resistance switching dielectric 116 can be in a range of from about 20 nm to about 50 nm.

The top electrode 118 is arranged over the resistance switching dielectric 116. The top electrode 118 may comprise tungsten at top to provide a good landing contact. The top electrode 118 or the underlying cap layer of the MTJ structure may also comprise one or more other metal or metal composition layers comprising, for example, titanium, titanium nitride, tantalum, tantalum nitride, or the like. An example thickness of the top electrode 118 can be in a range of from about 30 nm to about 40 nm. In some embodiments, the top electrode 118 is electrically coupled to the top metallization line 134 of the upper interconnect structure 142 through a top electrode via 132 arranged between the top electrode 118 and the top metallization line 134. The top electrode via 132 may be, for example, a conductive material, such as such as copper, aluminum, cobalt, or tungsten. A barrier liner 131 may be disposed under the top electrode via 132 and functions as a diffusion barrier layer to prevent material from diffusing between the top electrode via 132 and the top electrode 118. The barrier liner 131 may comprise tantalum nitride, for example. An example thickness of the barrier liner 131 can be in a range of from about 5 nm to about 10 nm.

Figure 5:
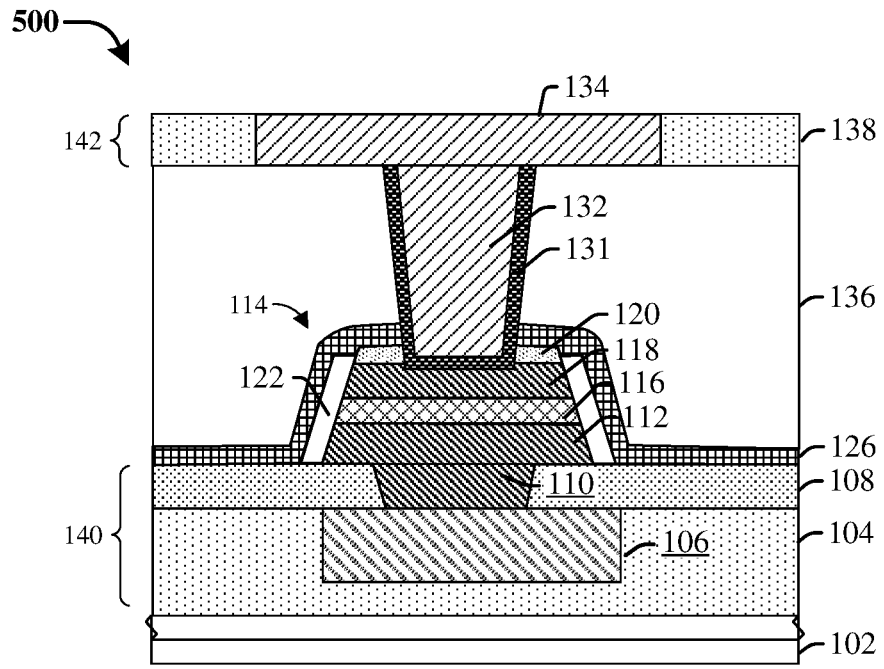
FIG. 5 illustrates a cross-sectional view of some alternative embodiments of a memory cell of FIG. 5 with insulating hard mask.

FIG. 5 illustrates a cross-sectional view 500 of a memory cell with insulating hard mask according to some alternative embodiments. Compared to FIG. 4, the sidewall spacer 122 is disposed on an upper surface of a lower dielectric layer 108 and extended upwardly along sidewalls of the bottom electrode 112, the resistance switching dielectric 116, and the top electrode 118, and may extend to a lower part or the whole sidewall surface of the hard mask insulator 120. The etch stop layer 126 is disposed on the upper surface of the lower dielectric layer 108, conformally line the sidewall spacer 122, and extend over the hard mask insulator 120. The etch stop layer 126 may directly contact and cover a top surface of the hard mask insulator 120. The top electrode via 132 may have a bottom surface landing on a recessed upper surface of the top electrode 118. The etch stop layer 126 and the hard mask insulator 120 may both contact a lower sidewall of the barrier liner 131 or the top electrode via 132 and have inner sidewall surfaces substantially aligned or coplanared.

Figure 6:
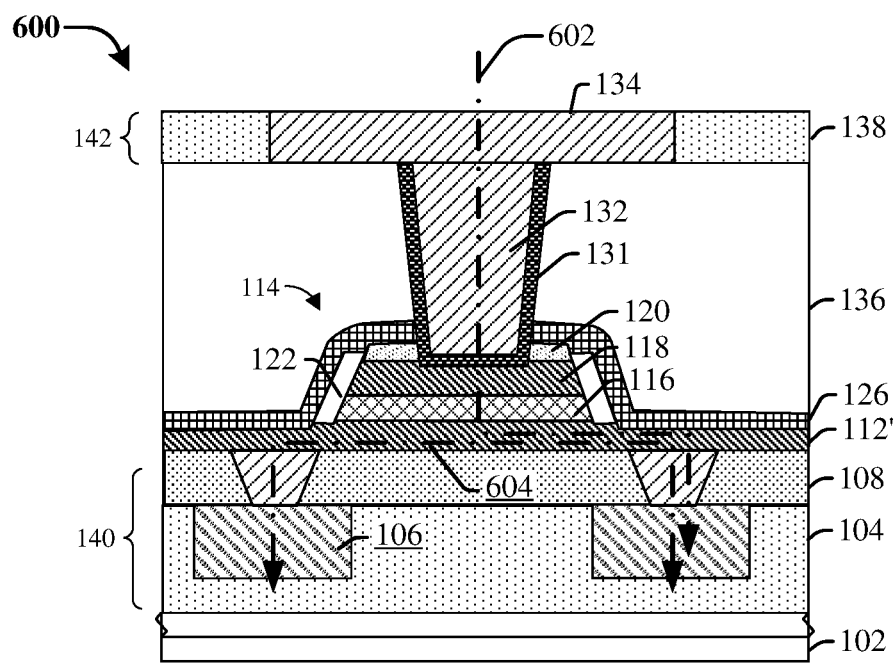
FIG. 6 illustrates a cross-sectional view of some alternative embodiments of a memory cell of FIG. 4 and FIG. 5 with insulating hard mask.

As mentioned above, the memory cell 114 can be any applicable non-volatile memory cells such as magnetoresistive random-access memory (MRAM) cell and resistive random access memory (RRAM) cell. FIG. 6 illustrates a cross-sectional view 600 of another example of a memory cell with insulating hard mask according to some embodiments alternative to FIG. 4 and FIG. 5. As shown by FIG. 6, sometimes referred as a SOT (spin-orbit torque) MRAM, switching of the resistance switching dielectric 116 is done by injecting an in-plane current in an adjacent SOT layer 112'. Thus, a three terminal MTJ is enabled that isolates a read path 602 from a write path 604, and thereby improving the device endurance and read stability. Moreover, due to SOT spin transfer geometry, incubation time is negligible which allows for a faster and more reliable switching operation.

Figure 7:
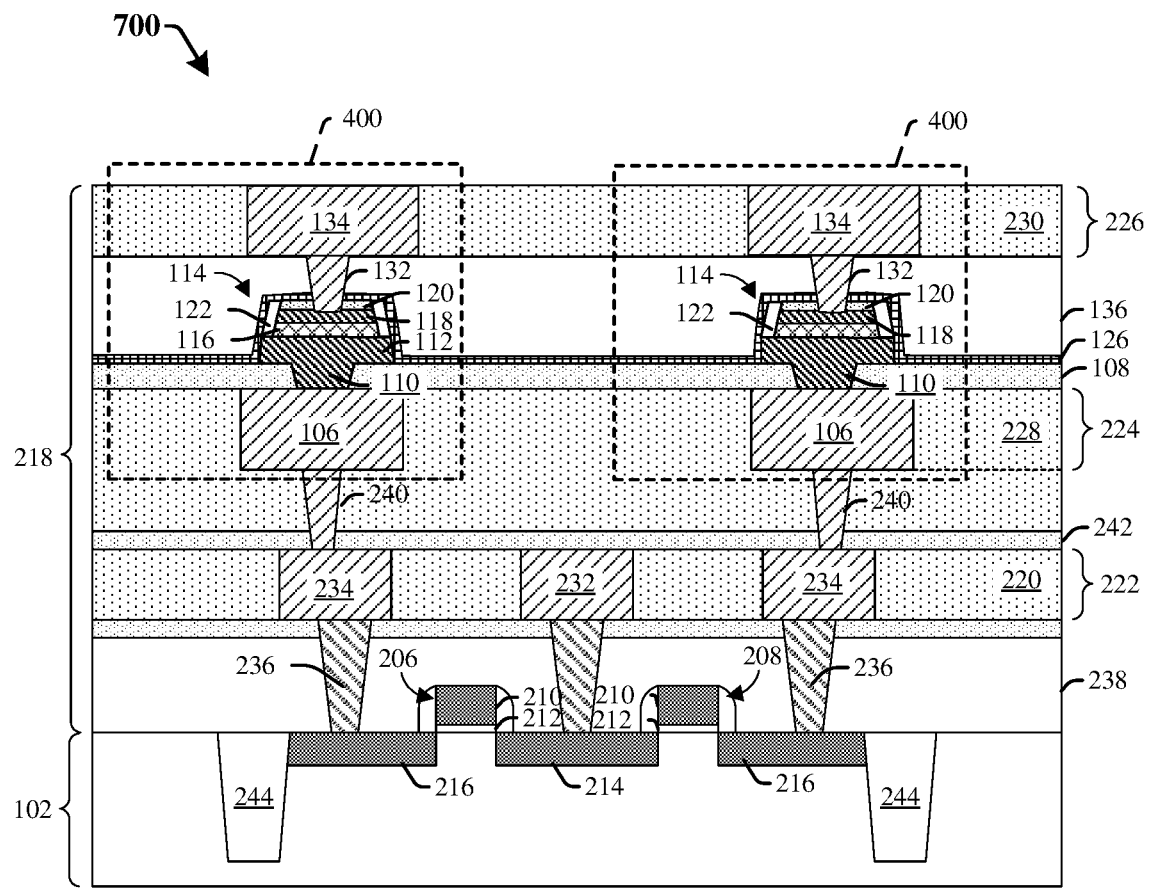
FIG. 7 illustrates a cross-sectional view of some embodiments of an integrated circuit with the memory cell of FIG. 4, FIG. 5, or FIG. 6.

FIG. 7 illustrates a cross-sectional view of an integrated circuit device 700 including the memory cell 114 according to some additional embodiments. The memory cell 114 may have a similar structure as any of the memory cells 114 shown in FIGS. 4-6 and described above. As shown in FIG. 7, the memory cell 114 can be disposed over the substrate 102. The substrate 102 may be, for example, a bulk substrate (e.g., a bulk silicon substrate) or a silicon-on-insulator (SOI) substrate. One or more shallow trench isolation (STI) regions 244 or oxide-filled trenches are disposed in the substrate 102. A pair of word line transistors 206, 208 is spaced between the STI regions 244. The word line transistors 206, 208 extend parallel to each other, and include word line gates 210 separated from the substrate 102 by word line dielectric layers 212, and source/drain regions 214, 216. The source/drain regions 214, 216 are embedded within the surface of the substrate 102 between the word line gates 210 and the STI regions 244. The word line gates 210 may be, for example, doped polysilicon or a metal, such as titanium nitride or tantalum nitride. The word line dielectric layers 212 may be, for example, an oxide, such as silicon dioxide. A bottom-most ILD layer 238 is disposed overlying the word line transistors 206, 208. The bottom-most ILD layer 238 may be an oxide.

A back-end-of-line (BEOL) metallization stack 218 is arranged over the word line transistors 206, 208. The BEOL metallization stack 218 includes a plurality of metallization layers 222, 224, 226 respectively arranged within the interlayer dielectric layers 220, 228, 230. The metallization layers 222, 224, 226 may be, for example, a metal, such as copper or aluminum. The interlayer dielectric layers 220, 228, 230 may be, for example, a low κ dielectric, such as porous undoped silicate glass, or an oxide, such as silicon dioxide. Etch stop layers 126, 242 may be disposed to separate the interlayer dielectric layers 220, 228, 230. The metallization layers 222, 224, 226 include a source line 232 coupled to a source/drain region 214 shared by the word line transistors 206, 208. Further, the metallization layers 222, 224, 226 include a bit line connected to the memory cell 114 and further connected to a source/drain region 216 of the word line transistor 206 or the word line transistor 208 through a plurality of metallization lines, such as metallization lines 106, 234, and a plurality of vias, such as vias 132, 110, 240. A contact 236 extends from the metallization line 234 through the bottom-most ILD layer 238 to reach the source/drain region 216. The vias 132, 110, 240 and the contact 236 may be, for example, a metal, such as copper, gold, or tungsten.

The memory cell 114 is inserted between a top metallization line 134 and a bottom metallization line 106. An upper dielectric layer 136 is disposed overlying the memory cell 114 between the interlayer dielectric layers 228, 230. The upper dielectric layer 136 may be an oxide. Though the memory cell 114 is shown as inserted between the upper metallization layer 226 and the lower metallization layer 224 in FIG. 7, it is appreciated that the memory cell 114 can be inserted between any two of the metallization layers of the BEOL metallization stack 218.

Similar as described above associated with FIGS. 4-6, the memory cell 114 comprises the bottom electrode 112 connecting or seamless contacting the bottom electrode via 110. The resistance switching dielectric 116 is disposed over the bottom electrode 112. The top electrode 118 is disposed over the resistance switching dielectric 116. The hard mask insulator 120 is disposed on the top electrode 118 and has its top surface covered by the etch stop layer 126. The sidewall spacer 122 may be disposed on the top surface of the bottom electrode 112 and extends upwardly along sidewalls of the resistance switching dielectric 116 and the top electrode 118 as shown by FIG. 4. Alternatively, the sidewall spacer 122 may also be disposed on the top surface of the lower dielectric layer 108 or other dielectric materials and extends upwardly along sidewalls of the bottom electrode 112, the resistance switching dielectric 116, and the top electrode 118 as shown by FIG. 5. The etch stop layer 126 is disposed on the top surface of the lower dielectric layer 108 or other dielectric materials and extends upwardly along sidewalls of the sidewall spacer 122. The top electrode via 132 connects the top metallization line 134 and the top electrode 118. The top electrode via 132 may have a bottom surface landing on a recessed upper surface of the top electrode 118. The hard mask insulator 120 may be a partial remaining of the first insulating layer 1108 shown in FIG. 2 or FIG. 3 from the memory cell patterning process. The first insulating layer 1108 is disposed at bottom of the hard masking stack contacting and separating the top electrode layer 1006 from the first metal hard masking layer 1110, such that prevents the shrinking or necking problem of the top electrode layer 1006 or the first metal hard masking layer 1110 (referring to FIG. 2 or FIG. 3).

FIGS. 8-19 illustrate some embodiments of cross-sectional views showing a method of forming an integrated circuit device.

Figure 8:
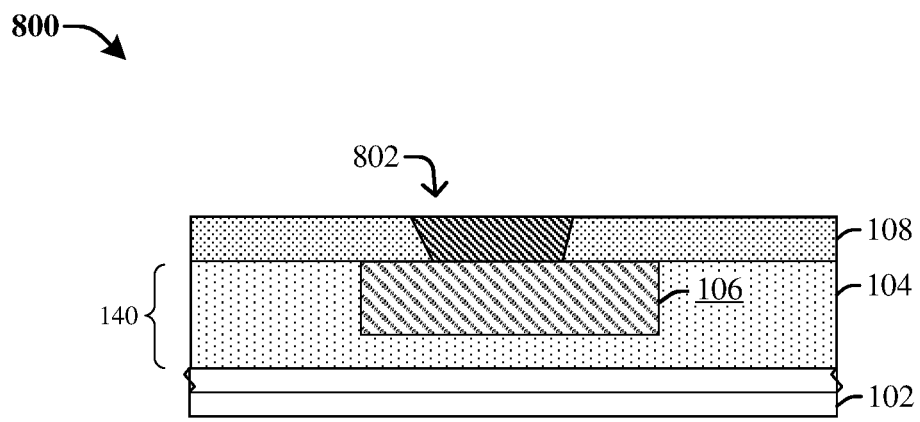
FIGS. 8-19 illustrate a series of cross-sectional views of some embodiments of an integrated circuit at various stages of manufacture, the integrated circuit including a memory cell.

As shown in cross-sectional view 800 of FIG. 8, a bottom via opening 802 is formed within a lower dielectric layer 108 overlying a lower interconnect structure 140. The lower interconnect structure 140 includes a bottom metallization line 106 laterally surrounded by a bottom interlayer dielectric layer 104. The bottom interlayer dielectric layer 104 may be, for example, a low-k dielectric, and the bottom metallization line 106 may be, for example, a metal, such as copper. The lower dielectric layer 108 is formed over the lower interconnect structure 140 with the bottom via opening 802 exposing the bottom metallization line 106. The lower dielectric layer 108 may comprise, for example, one or more layers of dielectrics, such as silicon dioxide, silicon carbide, and/or silicon nitride. The process for forming the bottom via opening 802 may include depositing the lower dielectric layer 108 over the lower interconnect structure 140 followed by a photolithography process. A photoresist layer may be formed over the lower dielectric layer 108 and exposing regions of lower dielectric layer 108 corresponding to the bottom via opening 802 to be formed. Then, one or more etchants selective of the lower dielectric layer 108 may be applied according to the photoresist layer. After applying the one or more etchants, the photoresist layer may be removed. A bottom electrode via 110 is then formed over the lower dielectric layer 108 and filling the bottom via opening 802. The bottom electrode via 110 may be, for example, formed of one or more layers of conductive materials, such as polysilicon, titanium nitride, tantalum nitride, platinum, gold, iridium, ruthenium, tungsten, or the like. For example, the bottom electrode via 110 may be a titanium nitride layer formed by an atomic layer deposition (ALD) process, followed by a planarization process.

Figure 9:
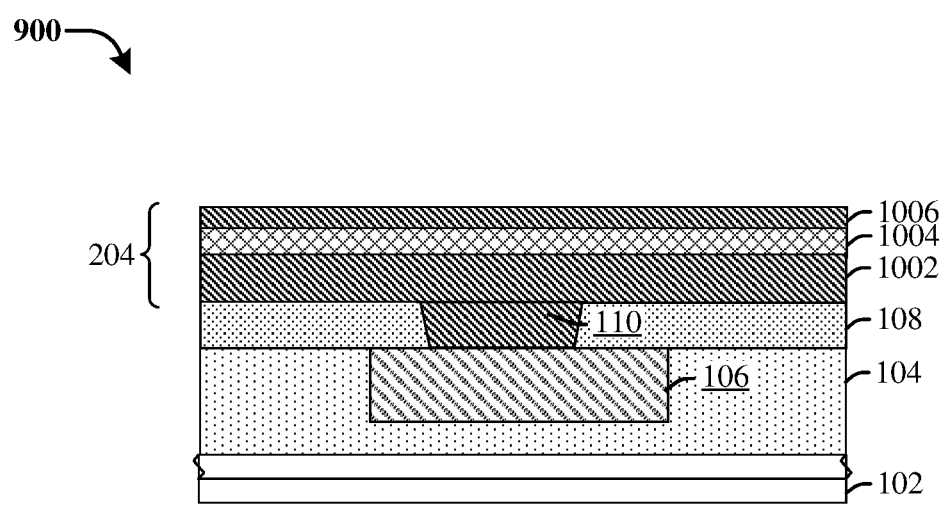

As shown in cross-sectional view 900 of FIG. 9, a memory cell stack 204 of a memory cell is deposited over the lower dielectric layer 108 by a series of vapor deposition techniques (e.g., physical vapor deposition, chemical vapor deposition, etc.). In some embodiments, a bottom electrode layer 1002 is formed over the bottom electrode via 110 and the lower dielectric layer 108. The bottom electrode layer 1002 may comprise a metal nitride (e.g., titanium nitride (TiN), tantalum nitride (TaN), or the like) and/or a metal (e.g., titanium (Ti), tantalum (Ta), or the like). In some embodiments, the bottom electrode layer 1002 may be the same material as the bottom electrode via and may even be formed in one deposition process together with the bottom electrode via 110. A planarization process may be subsequently performed to form a planar top surface for the bottom electrode layer 1002. Then a resistance switching dielectric layer 1004 is formed over the bottom electrode layer 1002. In some embodiments, the resistance switching dielectric layer 1004 may comprise a magnetic tunnel junction (MTJ) structure having a pinned magnetic layer and a free magnetic layer, which are vertically separated by a dielectric barrier layer. In other embodiments, the resistance switching dielectric layer 1004 may comprise a RRAM dielectric data storage layer. In some embodiments, the resistance switching dielectric layer 1004 may comprise a metal oxide composite such as hafnium aluminum oxide (HfAlO$_x$), zirconium oxide (ZrO$_x$), aluminum oxide (AlO$_x$), nickel oxide (NiO$_x$), tantalum oxide (TaO$_x$), or titanium oxide (TiO$_x$). A top electrode layer 1006 is formed over the resistance switching dielectric layer 1004. The top electrode layer 1006 may comprise one or more conductive layers. In some embodiments, the top electrode layer 1006 may comprise titanium nitride (TiN) or tantalum nitride (TaN), a metal (e.g., titanium (Ti) or tantalum (Ta) copper) etc. In some embodiments, the top electrode layer 1006 may be made of or at least include tungsten at top in order to provide a good landing contact. In some embodiments, the top electrode layer 1006 may have a thickness in a range of about 20 nm to about 70 nm.

Figure 10:
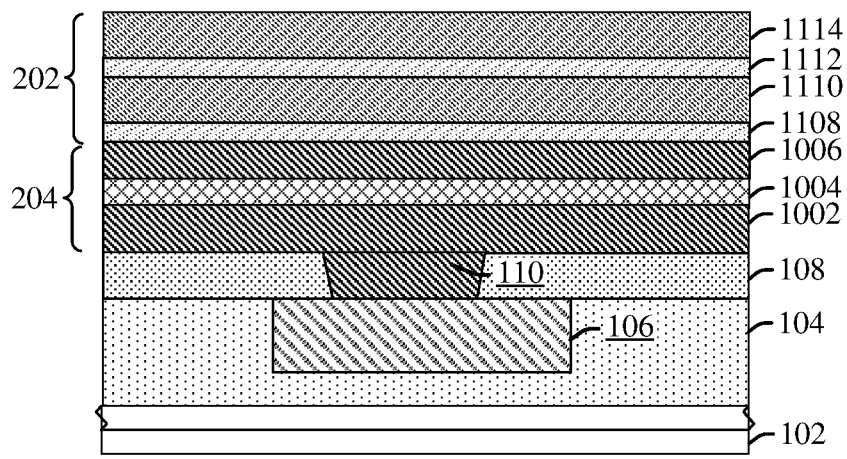
Figure 11:
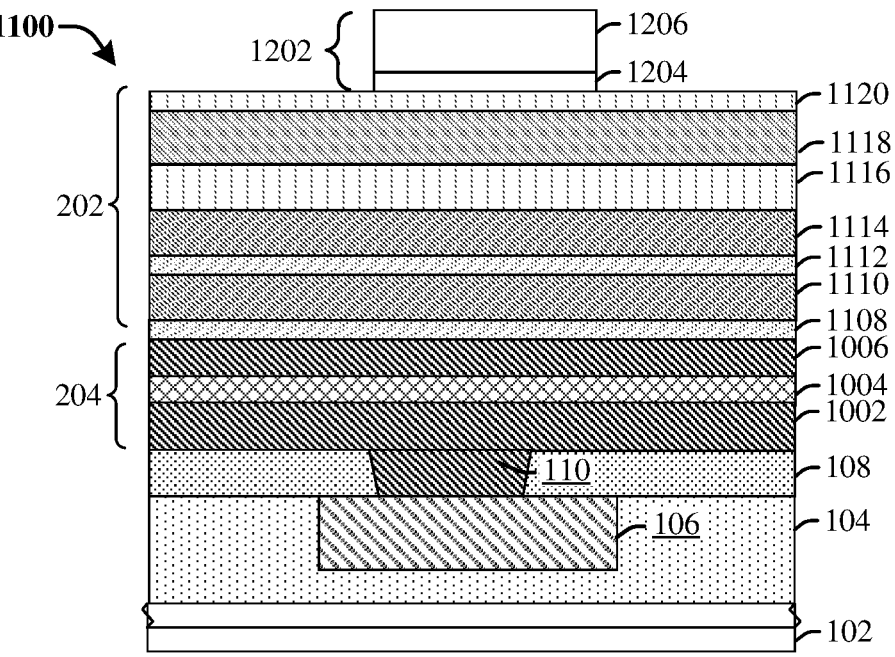

As shown in cross-sectional view 1000 of FIG. 10 and cross-sectional view 1100 of FIG. 11, a hard masking stack 202 is formed over the memory cell stack 204. The hard masking stack 202 may include a first insulating layer 1108 formed at bottom contacting the top electrode layer 1006 and a first metal hard masking layer 1110 formed on the first insulating layer 1108. The first metal hard masking layer 1110 may comprise or be made of a second kind of metal material (for example, tantalum) different from that of the top electrode layer 1006 (for example, tungsten). The first insulating layer 1108 is disposed at bottom of the hard masking stack contacting and separating the top electrode layer 1006 from the first metal hard masking layer 1110, such that prevents the shrinking or necking problem of the first metal hard masking layer 1110 (or the top electrode layer 1006). In some further embodiments, the hard masking stack 202 may comprise more than one set of metal hard masking layer and insulating layer one stacked over another. The additional sets of metal hard masking layers and insulating layers provide greater masking thickness for the memory cell patterning. For example, a second insulating layer 1112 can be formed on the first metal hard masking layer 1110, and a second metal hard masking layer 1114 can be formed on the second insulating layer 1112. The second insulating layer 1112 separates the first metal hard masking layer 1110 and the second metal hard masking layer 1114, such that prevents the shrinking or necking problem of the first metal hard masking layer 1110 or the second metal hard masking layer 1114. The second metal hard masking layer 1114 may comprise a third kind of metal material different from that of the first metal hard masking layer 1110 or the top electrode layer 1006 (for example, tantalum nitride). The second insulating layer 1112 may comprise same or different dielectric material than that of the first insulating layer 1108 (for example, silicon dioxide). The first and second insulating layers 1108, 1112 may be formed by deposition techniques such as chemical vapor deposition (CVD), physical vapor deposition (PVD) or other application processes. In some embodiments, the first insulating layer 1108 and/or the second insulating layer 1112 may respectively have a thickness in a range of from about 3 nm to about 10 nm. The first insulating layer 1108 and/or the second insulating layer 1112 may respectively comprise or be made of silicon dioxide, silicon nitride, silicon carbide, or the combination thereof. Other dielectric materials are within the scope of disclosure to made the first insulating layer 1108 and/or the second insulating layer 1112.

As shown in cross-sectional view 1100 of FIG. 11, a first dielectric hard masking layer 1116 may be formed over the sets of metal hard masking layer and insulating layer. In some further embodiments, the hard masking stack 202 may comprise more than one dielectric hard masking layer one stacked over another to provide greater masking thickness for the memory cell patterning. The dielectric hard masking layers may be separated by amorphous carbon film and/or diamond-like carbon film. For example, an amorphous carbon film 1118 may be formed on the first dielectric hard masking layer 1116, and a second dielectric hard masking layer 1120 may be formed on the amorphous carbon film 1118. The first dielectric hard masking layer 1116 and the second dielectric hard masking layer 1120 may comprise same or different dielectric materials such as silicon oxynitride (SiON) or silicon carbide.

Still as shown in cross-sectional view 1100 of FIG. 11, a patterning layer 1202 is formed over the hard masking stack 202. The patterning layer 1202 may include a bottom antireflective coating (BARC) layer 1204 and a photoresist layer 1206 which has been spin-coated over the BARC layer 1204 and patterned, for example, using a double-patterning technique.

Figure 12:
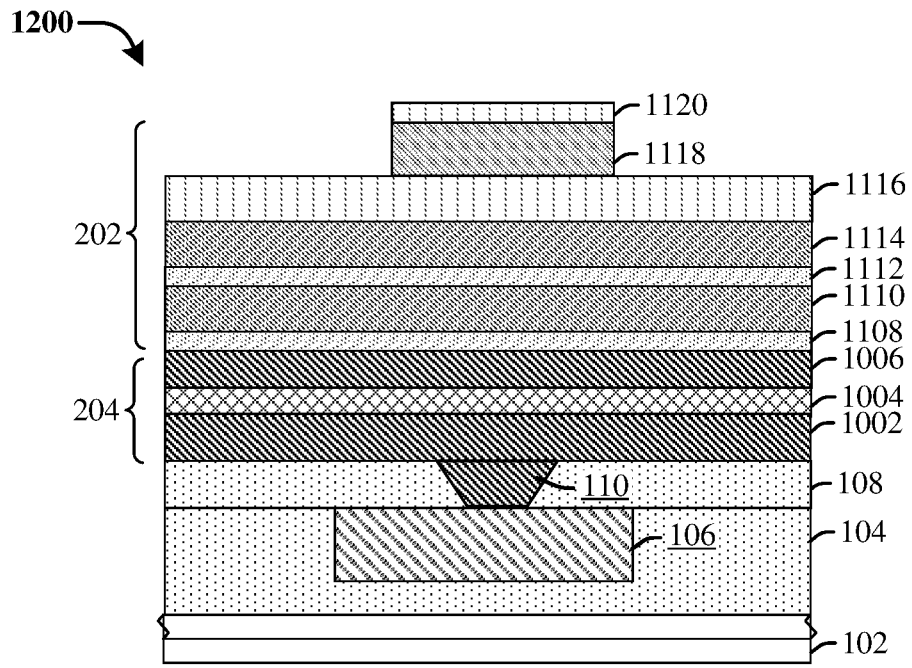

As shown in cross-sectional view 1200 of FIG. 12, as an example, the second dielectric hard masking layer 1120 and the amorphous carbon film 1118 may be patterned according to the patterning layer 1202 by a first series of etch. For emerging nodes fabrication processes, thickness of the photoresist layer 1206 is quite limited and can only pattern an underlying layer with a limited thickness. The patterned amorphous carbon film 1118 is used as a transferred masking layer to pattern the first dielectric hard masking layer 1116. The amorphous carbon film 1118 may have a thickness about 1.2 to 2.5 times greater than that of the photoresist layer 1206. The first dielectric hard masking layer 1116 may have a thickness 2 to 4 times greater than that of the second dielectric hard masking layer 1120. The patterned second dielectric hard masking layer 1120 may be removed after the patterning of the amorphous carbon film 1118. The patterned amorphous carbon film 1118 may be removed after the patterning of the first dielectric hard masking layer 1116.

Figure 13:
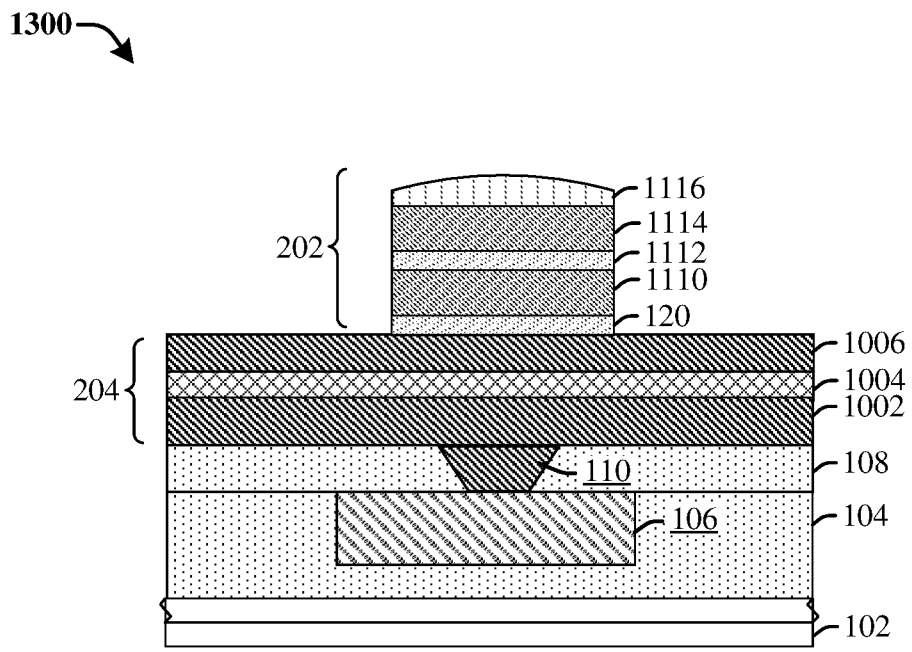

As shown in cross-sectional view 1300 of FIG. 13, as an example, the sets of metal hard masking layers and insulating layers (e.g. 1114, 1112, 1110, 1108) are patterned according to the patterned first dielectric hard masking layer 1116 by a second series of etch. The first insulating layer 1108 may be patterned according to the metal hard masking layers (e.g. 1114, 1110) to form a hard mask insulator 120. The first dielectric hard masking layer 1116 may be partially consumed during the patterning process. In some embodiments, the patterning process can comprise a dry etching process that may have an etchant chemistry including $CF_4$, $CH_2F_2$, $Cl_2$, $BCl_3$ and/or other chemicals. The second metal hard masking layer 1114 may comprise tantalum nitride and may be patterned by an etchant containing $SF_6$, $CF_4$, $CH_2F_2$, $CHF_3$, $Cl_2$, $BCl_3$ and/or other chemicals. The first metal hard masking layer 1110 may comprise tantalum and may be patterned by an etchant containing $SF_6$, $CF_4$, $CH_2F_2$, $CHF_3$, $Cl_2$, $BCl_3$ and/or other chemicals.

Figure 14:
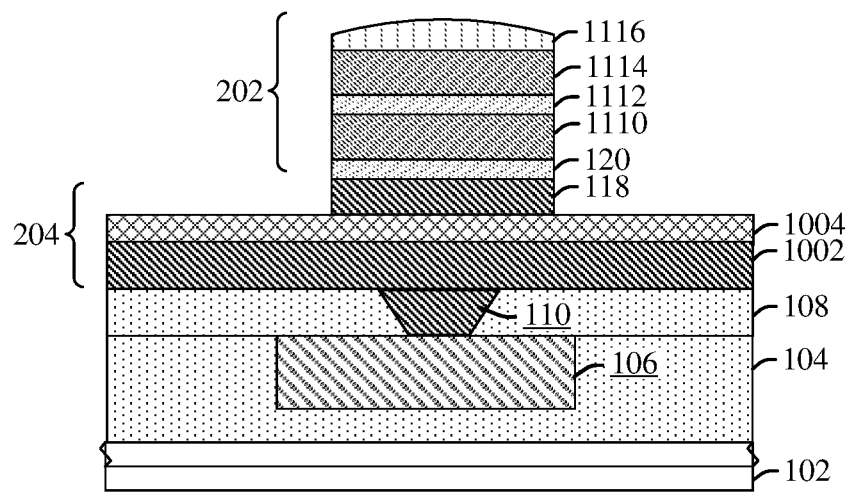

As shown in cross-sectional view 1400 of FIG. 14, the top electrode layer 1006 is patterned to form a top electrode 118 according to the patterned hard masking stack 202. The hard masking stack 202 includes the patterned first metal hard masking layer 1110 and the hard mask insulator 120, and may also include some remaining of the masking layers above the first metal hard masking layer 1110. The top electrode layer 1006 may comprise tungsten and may be patterned by an etchant containing $SF_6$, $CF_4$, $CHF_3$ and or other chemicals.

Figure 15:
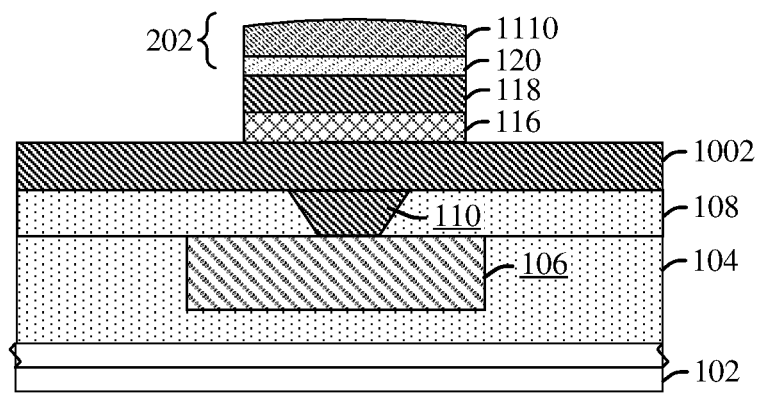

As shown in cross-sectional view 1500 of FIG. 15, the resistance switching dielectric layer 1004 (shown in FIG. 134) is patterned to form a resistance switching dielectric 116 according to the hard masking stack 202 and the top electrode 118. During the patterning process, the hard masking stack 202 may be partially removed or reduced. The bottom electrode layer 1002 may be exposed. In some embodiments, sidewalls of the resistance switching dielectric 116 and the top electrode 118 can be tilted and aligned (e.g., co-planar). In some embodiments, the patterning process can comprise a dry etching or ion beam etching or combined process that may have an etchant chemistry including $CF_4$, $CH_2F_2$, $Cl_2$, $BCl_3$, $CO/NH_3$, $CH_3OH$, $CH_4$, $H_2$, Ar, Kr, Xe and/or other chemicals.

Figure 16:
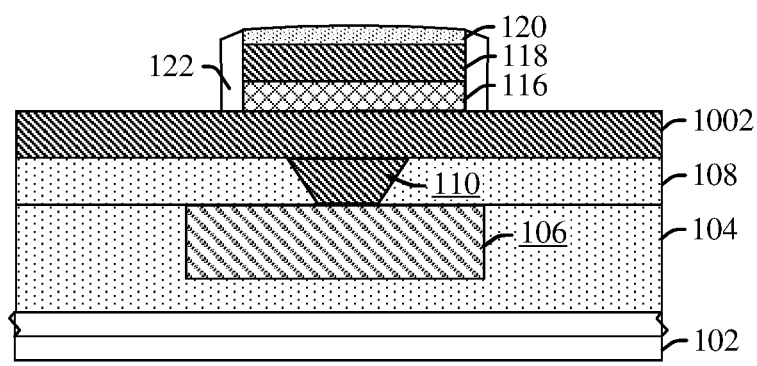

As shown in cross-sectional view 1600 of FIG. 16, a sidewall spacer 122 may be formed along sidewall surfaces of the resistance switching dielectric 116, the top electrode 118, and the hard mask insulator 120. In some embodiments, the sidewall spacer 122 may be formed by forming a dielectric spacer layer along an upper surface of the bottom electrode layer 1002, extending along sidewall surfaces of the resistance switching dielectric 116, the top electrode 118, the hard mask insulator 120, and the hard masking stack 202, and covering a top surface of the hard masking stack 202. The dielectric spacer layer may comprise silicon nitride, tetraethyl orthosilicate (TEOS), silicon-rich oxide (SRO), or a similar composite dielectric film. In some embodiments, the dielectric spacer layer may be formed by a vapor deposition technique (e.g., physical vapor deposition, chemical vapor deposition, etc.). Then, an anisotropic etch (e.g. a vertical etch) is performed to remove lateral stretches of the dielectric spacer layer, thereby resulting in the sidewall spacer 122 along the sidewall surfaces of the resistance switching dielectric 116 and the top electrode 118. The bottom electrode layer 1002 may be exposed as a result of removing the lateral stretches of the dielectric spacer layer. The hard masking stack 202 and an upper portion of the hard mask insulator 120 may be removed during the etching process.

Figure 17:
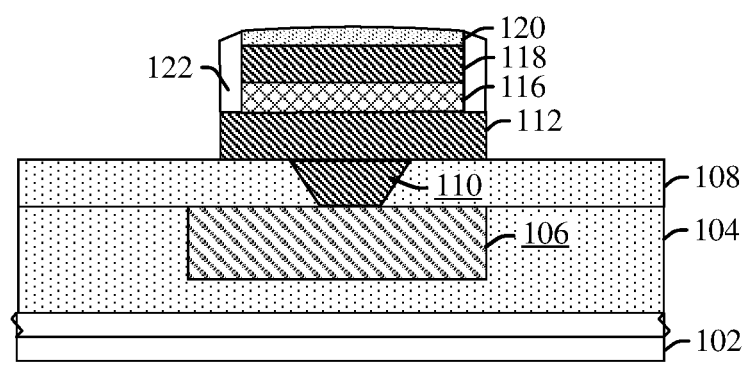

As shown in cross-sectional view 1700 of FIG. 17, an etch is performed to pattern the bottom electrode layer 1002 and form a bottom electrode 112 according to the sidewall spacer 122. The etch can comprise a dry etch such as a plasma etching process that may have an etchant chemistry including $CF_4$, $CH_2F_2$, $Cl_2$, $BCl_3$ and/or other chemicals. As a result of the etching process, the bottom electrode 112 may have sidewalls aligned with that of the sidewall spacer 122, and a lower dielectric layer 108 may be exposed.

Figure 18:
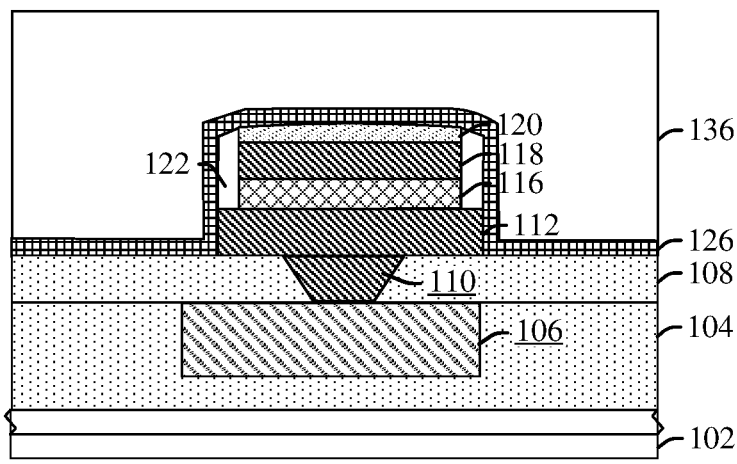

As shown in cross-sectional view 1800 of FIG. 18, an etch stop layer 126 may be conformally formed lining outlines of the workpiece. The etch stop layer 126 may comprise silicon nitride, tetraethyl orthosilicate (TEOS), silicon-rich oxide (SRO), or a similar composite dielectric film. In some embodiments, the etch stop layer 126 may be formed by a vapor deposition technique (e.g., physical vapor deposition, chemical vapor deposition, etc.). The etch stop layer 126 is formed to prepare for the protection of the memory cell from the top electrode via opening and landing process, as described later on. For example, the etch stop layer 126 may have a thickness in a range of from about 20 nm to about 25 nm.

Still as shown in cross-sectional view 1800 of FIG. 18, an upper dielectric layer 136 is formed over and surrounding the memory cell. The upper dielectric layer 136 may be, for example, a low-k or an extreme low-k dielectric. In some embodiments, the process for forming The upper dielectric layer 136 includes depositing an intermediate interlayer dielectric layer and performing a chemical mechanical polish (CMP) into the intermediate interlayer dielectric layer to planarize the top surface of the intermediate interlayer dielectric layer.

Figure 19:
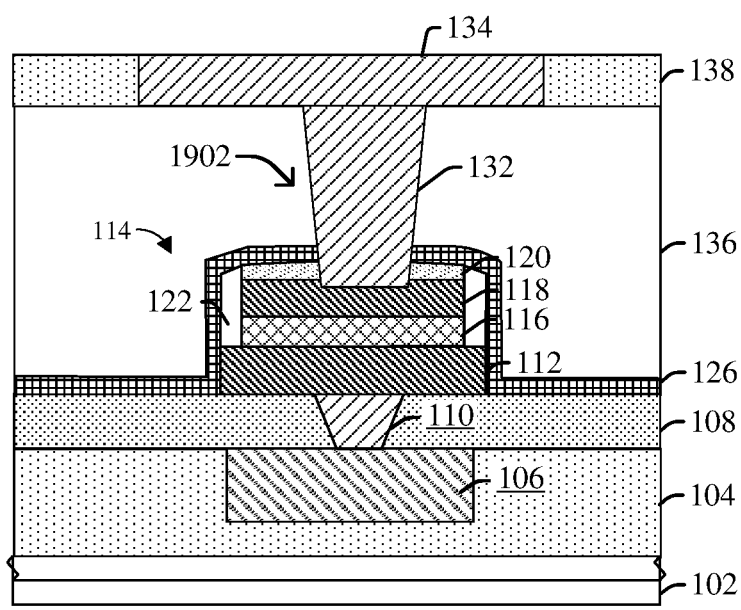

As shown in cross-sectional view 1900 of FIG. 19, a top electrode via opening 1902 is formed through The upper dielectric layer 136 and the hard mask insulator 120 and reaches on the top electrode 118. A conductive layer is then formed filling the top electrode via opening 1902 to form a top electrode via 132. The conductive layer may be, for example, a metal, such as copper or tungsten. The process for forming the conductive layer may include depositing an intermediate conductive layer filling the top electrode via opening 1902 and overhanging The upper dielectric layer 136 to form the top electrode via 132 and to form a top metallization line 134. Photolithography may then be used to pattern the conductive layer. In some embodiments, the top electrode via 132 and the top metallization line 134 may be formed by a single damascene process, a trench-first or a via-first dual damascene process, or other applicable metal filling processes. As a result of the filling, the top electrode via 132 may have a bottom surface contacting a recessed upper surface of the top electrode 118.

Figure 20:
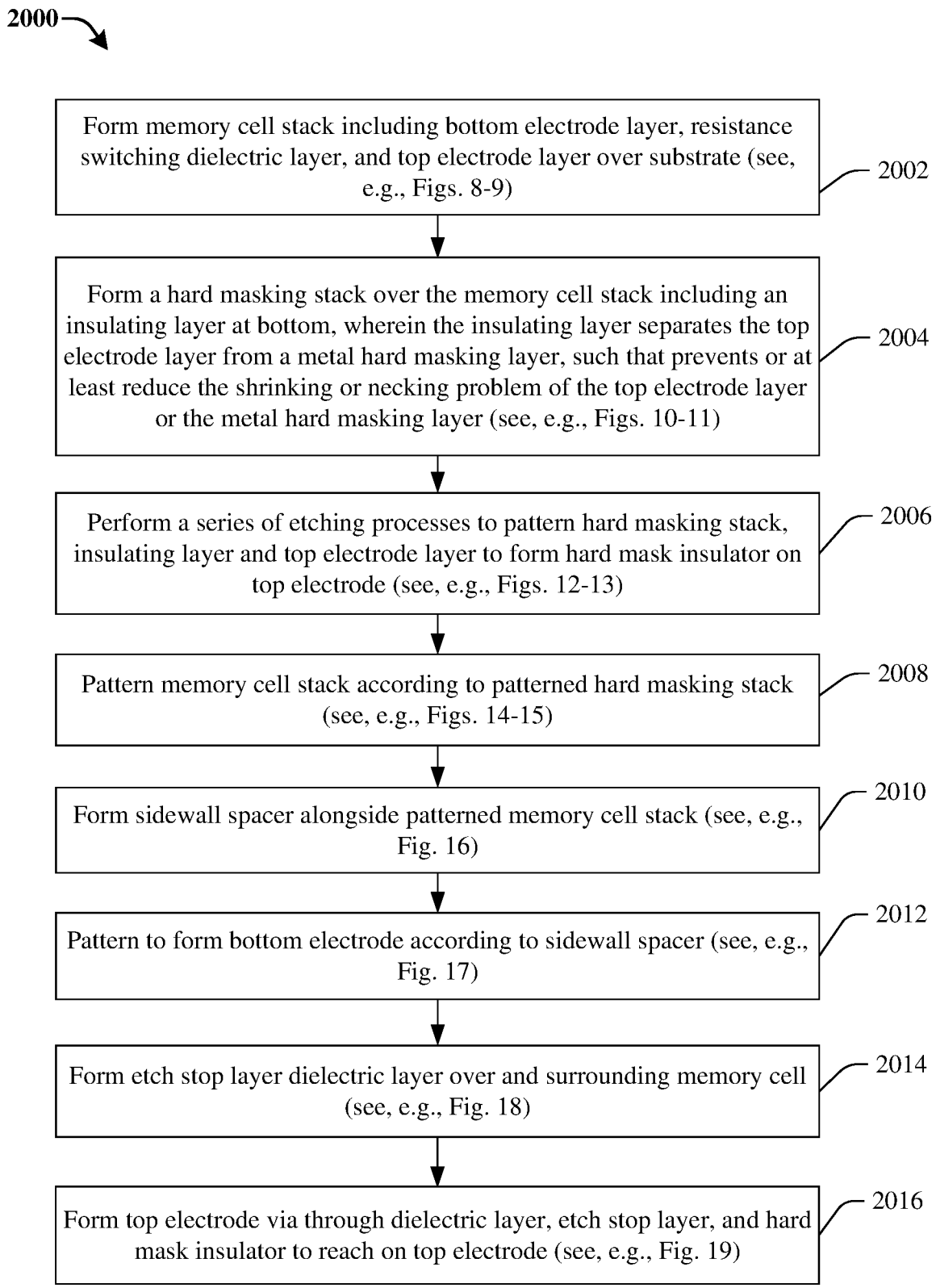
FIG. 20 illustrates a flow diagram of some embodiments of a method for manufacturing an integrated circuit with a memory cell.

FIG. 20 shows some embodiments of a flow diagram of a method 2000 of forming a memory device. Although method 2000 is described in relation to FIGS. 8-19, it will be appreciated that the method 2000 is not limited to such structures disclosed in FIGS. 8-19, but instead may stand alone independent of the structures disclosed in FIGS. 8-19. Similarly, it will be appreciated that the structures disclosed in FIGS. 8-19 are not limited to the method 2000, but instead may stand alone as structures independent of the method 2000. Also, while disclosed methods (e.g., method 2000) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2002, a memory cell stack is formed over a lower interconnect structure of a substrate. The memory cell stack may at least include a bottom electrode layer, a resistance switching dielectric layer, and a top electrode layer over the substrate. The lower interconnect structure may comprise a bottom metallization line laterally surrounded by a bottom interlayer dielectric layer. A bottom electrode via is formed through the lower dielectric layer to electrically couple the bottom metallization line to the bottom electrode layer. The bottom electrode via may be a titanium nitride layer formed by an atomic layer deposition (ALD) process, followed by a planarization process. The memory cell stack may be deposited over the lower dielectric layer by a series of vapor deposition techniques (e.g., physical vapor deposition, chemical vapor deposition, etc.). In some embodiments, the bottom electrode layer may comprise a metal nitride (e.g., titanium nitride (TiN), tantalum nitride (TaN), or the like) and/or a metal (e.g., titanium (Ti), tantalum (Ta), or the like). In some embodiments, the resistance switching dielectric layer may comprise a magnetic tunnel junction (MTJ) structure having a pinned magnetic layer and a free magnetic layer, which are vertically separated by a dielectric barrier layer. In other embodiments, the resistance switching dielectric layer may comprise a RRAM dielectric data storage layer. In some embodiments, the top electrode layer may comprise titanium nitride (TiN) or tantalum nitride (TaN), a metal (e.g., titanium (Ti) or tantalum (Ta) copper) etc. FIGS. 8-9 illustrate some embodiments of cross-sectional views 800 and 900 corresponding to act 2002.

At act 2004, a hard masking stack is formed over the memory cell stack. The hard masking stack may include a first insulating layer formed at bottom contacting the top electrode layer and a first metal hard masking layer formed on the first insulating layer. The first metal hard masking layer may be made of a second kind of metal material (for example, tantalum) different from that of the top electrode layer (for example, tungsten). The first insulating layer separates the top electrode layer from the first metal hard masking layer, such that prevents the shrinking or necking problem of the first metal hard masking layer (or the top electrode layer). In some further embodiments, the hard masking stack may be formed of more than one set of metal hard masking layer and insulating layer one stacked over another. The additional sets of metal hard masking layers and insulating layers provide greater masking thickness for the memory cell patterning. A first dielectric hard masking layer may be formed over the sets of metal hard masking layer and insulating layer. In some further embodiments, the hard masking stack may further include more than one dielectric hard masking layer one stacked over another to provide greater masking thickness for the memory cell patterning. The dielectric hard masking layers may be separated by amorphous carbon film or diamond-like carbon film. FIGS. 10-11 illustrate some embodiments of cross-sectional views 1000 and 1100 corresponding to act 2004.

At act 2006, the hard masking stack is patterned. The dielectric hard masking layers may be patterned according to a patterning layer by a first series of etch. The metal hard masking layers and insulating layers (e.g. 1114, 1112, 1110, 1108) are patterned according to the patterned dielectric hard masking layer by a second series of etch. The first insulating layer may be etched to form a hard mask insulator on top of the top electrode layer. FIGS. 12-13 illustrate some embodiments of cross-sectional views 1200 and 1300 corresponding to act 2006.

At act 2008, the memory cell stack is patterned. In some embodiments, the top electrode layer is patterned according to the patterned hard masking stack to form a top electrode. The resistance switching dielectric layer may be patterned according to the top electrode to form a resistance switching dielectric. During the patterning process, the hard masking stack may be partially removed or reduced. In some embodiments, sidewalls of the resistance switching dielectric and the top electrode can be tilted and aligned (e.g., co-planar).

FIGS. 14-15 illustrate some embodiments of cross-sectional views 1400 and 1500 corresponding to act 2008.

At act 2010, in some embodiments, a sidewall spacer is formed on the bottom electrode layer and alongside sidewalls of the resistance switching dielectric and the top electrode. The sidewall spacer may be formed by depositing a dielectric spacer layer by a vapor deposition technique (e.g., chemical vapor deposition, etc.) along an upper surface of the bottom electrode layer, extending along sidewall surfaces of the resistance switching dielectric, the top electrode, and the hard mask, and covering a top surface of the hard mask. An anisotropic etch (e.g. a vertical etch) is then performed to pattern and form a bottom electrode according to the sidewall spacer and the hard mask insulator. FIG. 16 illustrates some embodiments of a cross-sectional view 1600 corresponding to act 2010.

At act 2012, in some embodiments, the bottom electrode layer is patterned according to the sidewall spacer to form a bottom electrode. In some embodiments, sidewalls of the bottom electrode and the sidewall spacer can be tilted and aligned (e.g., co-planar). FIG. 17 illustrates some embodiments of a cross-sectional view 1700 corresponding to act 2012.

At act 2014, an etch stop layer may be formed by a vapor deposition technique (e.g., physical vapor deposition, chemical vapor deposition, etc.) to prepare for the protection of the memory cell from the top electrode via opening and landing process. A dielectric layer is formed over and surrounding the memory cell by depositing an intermediate interlayer dielectric layer and performing a chemical mechanical polish (CMP) into the intermediate interlayer dielectric layer to planarize the top surface of the intermediate interlayer dielectric layer. FIG. 18 illustrates some embodiments of a cross-sectional view 1800 corresponding to act 2014.

At act 2016, a top electrode via is formed through the dielectric layer, the etch stop layer, and the hard mask insulator and reach on the top electrode. A top metallization line is formed on the top electrode via and may overhang the dielectric layer. The top electrode via may have a bottom surface contacting a recessed upper surface of the top electrode. FIG. 19 illustrates some embodiments of a cross-sectional view 1900 corresponding to act 2016.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

Thus, as can be appreciated from above, in some embodiments, the present disclosure provides a method of manufacturing an integrated circuit (IC). In the method, a memory cell stack is formed over a substrate having a bottom electrode layer, a resistance switching dielectric layer over the bottom electrode layer, and a top electrode layer over the resistance switching dielectric layer. A first insulating layer is formed over the top electrode layer. A first metal hard masking layer is formed over the first insulating layer. Then, a series of etch is performed to pattern the first metal hard masking layer, the first insulating layer, the top electrode layer and the resistance switching dielectric layer to form a first metal hard mask, a hard mask insulator, a top electrode, and a resistance switching dielectric.

In another embodiment, the present disclosure relates to a method of manufacturing an integrated circuit (IC). In the method, a memory cell stack is formed over a substrate having a bottom electrode layer, a resistance switching dielectric layer over the bottom electrode layer, a top electrode layer over the resistance switching dielectric layer. A hard masking stack is formed over the memory cell stack. The hard masking stack comprises a first insulating layer at bottom contacting the top electrode layer and a first metal hard masking layer made of a metal material different from that of the top electrode layer. A series of etch is performed to pattern the hard masking stack, the top electrode layer, the resistance switching dielectric layer, and the bottom electrode layer to form a hard mask insulator, a top electrode, a resistance switching dielectric, and a bottom electrode.

In yet another embodiment, the present disclosure relates to a memory device. The memory device comprises a bottom electrode disposed over a substrate and a resistance switching dielectric disposed over the bottom electrode and having a variable resistance. A top electrode is disposed over the resistance switching dielectric. A hard mask insulator is disposed directly on the top electrode. A top electrode via is disposed through the hard mask insulator reaching on the top electrode. The hard mask insulator directly contacts the top electrode and comprises an insulating material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a memory cell, the method comprising:
    forming a memory cell stack over a substrate, the memory cell stack comprising a bottom electrode layer, a resistance switching dielectric layer over the bottom electrode layer, and a top electrode layer over the resistance switching dielectric layer;
    forming a first insulating layer over the top electrode layer;
    forming a first metal hard masking layer over the first insulating layer;
    forming a second insulating layer over the first metal hard masking layer;
    forming a second metal hard masking layer over the second insulating layer; and
    performing a series of etch to pattern the first metal hard masking layer, the first insulating layer, the top electrode layer and the resistance switching dielectric layer to form a first metal hard mask, a hard mask insulator, a top electrode, and a resistance switching dielectric.

2. The method of claim 1, wherein the top electrode layer is made of tungsten and the first metal hard masking layer is made of tantalum nitride.

3. The method of claim 1, wherein the first insulating layer is made of silicon dioxide, silicon nitride, silicon carbide, or the combination thereof.

4. The method of claim 1,
    wherein the second insulating layer is made of silicon dioxide and the second metal hard masking layer is made of tantalum.

5. The method of claim 4, wherein prior to performing the series of etch, further comprises forming a first dielectric hard masking layer directly on the second metal hard masking layer.

6. The method of claim 5, wherein prior to performing the series of etch, further comprises forming an amorphous carbon film over the first dielectric hard masking layer and a second dielectric hard masking layer over the amorphous carbon film.

7. The method of claim 6, wherein the second dielectric hard masking layer and the amorphous carbon film are removed after patterning the top electrode layer.

8. The method of claim 7, wherein the second metal hard masking layer and the second insulating layer are removed after patterning the resistance switching dielectric layer.

9. The method of claim 1, wherein the first insulating layer has a thickness in a range of from about 3 nm to about 10 nm.

10. The method of claim 1, further comprises:
    forming a dielectric spacer layer over the bottom electrode layer, extending alongside the resistance switching dielectric, and the top electrode, and further extending over the hard mask insulator.

11. The method of claim 10, further comprising:
    performing a first etch to the dielectric spacer layer to form a sidewall spacer alongside the resistance switching dielectric, the top electrode, and the hard mask insulator; and
    performing a second etch to pattern the bottom electrode layer according to the hard mask insulator and the sidewall spacer to form a bottom electrode, wherein the bottom electrode has a sidewall aligned with that of the sidewall spacer.

12. The method of claim 11, further comprising:
    forming an etch stop layer over the substrate, extending alongside the bottom electrode, the sidewall spacer, and further extending over the hard mask insulator;
    forming an upper dielectric layer over and surrounding the etch stop layer; and
    forming a top electrode via extending through the upper dielectric layer and the hard mask insulator to reach on the top electrode.

13. The method of claim 10, wherein the dielectric spacer layer is formed directly on the bottom electrode layer.

14. A method for manufacturing a memory cell, the method comprising:
    forming a memory cell stack over a substrate, the memory cell stack comprising a bottom electrode layer, a resistance switching dielectric layer over the bottom electrode layer, a top electrode layer over the resistance switching dielectric layer;
    forming a hard masking stack over the memory cell stack, wherein the hard masking stack comprises a first insulating layer at bottom contacting the top electrode layer and a first metal hard masking layer and a second metal hard masking layer disposed over the first insulating layer and separated from one another by a second insulating layer; and performing a series of etch to pattern the hard masking stack, the top electrode layer, the resistance switching dielectric layer, and the bottom electrode layer to form a hard mask insulator, a top electrode, a resistance switching dielectric, and a bottom electrode.

15. The method of claim 14, further comprising:
forming a sidewall spacer over the substrate, extending upwardly alongside sidewalls of the resistance switching dielectric, the top electrode, and the hard mask insulator; and
forming an etch stop layer directly on and conformally lining the sidewall spacer and an upper surface of the hard mask insulator.

16. The method of claim 15, further comprising: forming a top electrode via by:
forming an upper dielectric layer over and surrounding the etch stop layer; and
performing an etch through the upper dielectric layer and the hard mask insulator to form a via opening; and
filling the via opening with a metal material to form the top electrode via having a sidewall contacting the hard mask insulator and the etch stop layer.

17. A method for manufacturing a memory cell, the method comprising:
forming a bottom electrode over a substrate;
forming a resistance switching dielectric over the bottom electrode and having a variable resistance;
forming a top electrode over the resistance switching dielectric;
forming a hard mask insulator directly on the top electrode and comprising an insulating material; and
forming a top electrode via through the hard mask insulator reaching on the top electrode; and
wherein forming the hard mask insulator comprises forming and patterning a hard masking stack including a first metal hard masking layer and a second metal hard masking layer separated from one another by an insulating layer.

18. The method of claim 17, wherein the hard mask insulator has a thickness in a range of from about 3 nm to about 10 nm.

19. The method of claim 17, further comprising:
forming a sidewall spacer extending upwardly along sidewalls of the resistance switching dielectric, the top electrode, and the hard mask insulator; and
forming an etch stop layer directly and conformally lining the sidewall spacer;
wherein the sidewall spacer and the etch stop layer are made of silicon nitride or silicon carbide.

20. The method of claim 17, further comprising:
forming a bottom metallization line surrounded by a bottom interlayer dielectric layer and coupled to the bottom electrode through a bottom electrode via; and
forming a top metallization line surrounded by a top interlayer dielectric layer and coupled to the top electrode through the top electrode via.

* * * * *